(12) United States Patent
Kawakita et al.

(10) Patent No.: US 7,033,186 B2
(45) Date of Patent: Apr. 25, 2006

(54) ELECTRICAL CONNECTION BOX

(75) Inventors: Shinji Kawakita, Mie (JP); Shigeki Yamane, Mie (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/196,322

(22) Filed: Aug. 4, 2005

(65) Prior Publication Data

US 2006/0030177 A1    Feb. 9, 2006

(30) Foreign Application Priority Data

Aug. 9, 2004  (JP) .............................. 2004-232671

(51) Int. Cl.
*H01R 12/00*  (2006.01)
(52) U.S. Cl. .................................................... 439/76.2
(58) Field of Classification Search ................ 439/621, 439/949, 76.2
See application file for complete search history.

(56) References Cited

U.S. PATENT DOCUMENTS

| 5,519,561 | A | * | 5/1996 | Mrenna et al. | ............. | 361/105 |
| 5,915,978 | A | * | 6/1999 | Hayakawa et al. | ........ | 439/76.2 |
| 5,980,302 | A | * | 11/1999 | Saka | .......................... | 439/404 |
| 6,126,457 | A | * | 10/2000 | Smith et al. | ............... | 439/76.2 |
| 6,309,244 | B1 | * | 10/2001 | Gundermann et al. | ...... | 439/507 |
| 6,461,027 | B1 | * | 10/2002 | Yagi et al. | .................. | 362/505 |
| 6,494,723 | B1 | * | 12/2002 | Yamane et al. | ............ | 439/76.2 |

FOREIGN PATENT DOCUMENTS

JP      A 2003-164039      6/2003

* cited by examiner

*Primary Examiner*—Tulsidas C. Patel
*Assistant Examiner*—Harshad C Patel
(74) *Attorney, Agent, or Firm*—Oliff & Berridge, PLC

(57) ABSTRACT

A terminal portion of non-implementation branch path branched from a input terminal is disposed within a fuse box. A switching member separated from the input terminal is implemented in an implementation branch path. The terminal portion of the non-implementation branch path is connected to one end terminal portion of the implementation branch path via fuse. The other end terminal portion of the implementation branch path is connected to tan output terminal fitting.

2 Claims, 9 Drawing Sheets

ELECTRICAL CONNECTION BOX

BACKGROUND OF THE INVENTION

1. Field of the Invention

The present invention relates to an electrical connection box.

2. Description of the Related Art

An electrical connection box accommodates a circuit component into a case. The electrical connection box loaded in an automobile in JP-A-2003-164039. As shown in FIG. 8, the circuit component is constructed by a circuit substrate 101, a bus bar 102 arrayed along the circuit substrate 101, a relay 103 (switching member), a plurality of output terminal fittings 104 to which each electrical component is connected and a plurality of fuses 105. The bus bar 102 is provided with an input terminal 102A connected to a battery and a plurality of branch paths 102B branched from the input terminal 102A, the relay 103 is implemented into each branch path 102B, and a terminal portion 102C formed on the end of each branch path 102B is arranged inside the fuse box 106 provided on an outer edge of the case. Further, a fuse box 106 is provided with an output terminal fitting 104, and a terminal portion 104A of each output terminal fitting 104 is arranged to correspond to a terminal portion 102C of the bus bar 102. Then, when a fuse 105 is fixed to the fuse box 106, a space between the corresponding terminal portions 102C and 104A is connected via the fuse 105, thereby forming a flow of electricity output sequentially from the input terminal 102A via each branch path 102B, the fuse 105, the output terminal fitting 104 and to the electrical component.

SUMMARY OF THE INVENTION

In the electrical connection box, a relay 103 is arranged between an input terminal 102A and a fuse 105, namely more upstream than the fuse 105 in the flow of electricity. However, there is a case where the fuse 105 may be arranged more upstream than the relay 103 (between the input terminal 102A and the relay 103) in constructing circuits. In this instance, as shown in FIG. 9, there may be a construction in which a branch path 102Ba is divided so as to allow a fuse 105a to interpose therebetween and a direct fitting 107 is allowed to interpose directly between the terminal portions 102Ca and 104Aa inside the fuse box 106 in place of the fuse 105.

However, in view of the working efficiency of maintenance and others, as shown in FIG. 9, it is not preferable to disperse the fuses 105 and 105a at a plurality of positions. Further, since the branch paths 102B and 102Ba into which the relay 103 is implemented are accommodated into the case, arrangement of the fuse 105a halfway along the branch path 102Ba will make attachment and detachment of the fuse 105a extremely difficult.

It is an object of the invention is to arrange fuses collectively so that the fuses are arranged between an input terminal and a switching member such as a relay.

According to one aspect of the invention, there is provided an electrical connection box including: a case; a circuit component being accommodated into the case; the circuit component having; a circuit substrate; a switching member; a fuse; a plurality of output terminal fittings having a terminal portion; and a conducting path arrayed along a circuit substrate, the conducting path having; an input terminal connected to a battery; and a plurality of implementation branch paths branched from the input terminal, each implementation branch path implementing a switching member and having a terminal portion on an end portion thereof; and a fuse box being mounted on an outer edge portion of the case, the fusebox attaching the plurality of output terminal fittings to which an electrical external load having an electrical component is connected. The terminal portion of each implementation branch path is disposed to be corresponding to the terminal portion of each output terminal fitting. The fuse fixed to the fuse box connects the terminal portion of each implementation branch path to the terminal portion of each output terminal fitting, so that a flow of electricity output is sequentially formed from the input terminal via the implementation branch path, the fuse and the output terminal fitting. A non-implemented branch path branched from the input terminal has on an end side opposite to the input terminal a terminal portion which is arranged within the fuse box. The non-implemented branch path does not implement the switching member. An implemented circuit member separated from the input terminal has on both ends thereof a pair of terminal potion which is disposed in the fuse box. The implemented circuit member implements the switching member. A terminal portion of the non-implementation branch path is connected to one terminal portion of the implementation circuit member via the fuse in the fuse box. The electrical external load is connected to the other terminal portion of the implementation circuit member.

According to the above-aspect of the invention, a flow of electricity is formed sequentially from the input terminal via the non-implementation branch path, the fuse and the implementation circuit member to the output terminal fitting, and the switching member is implemented into the implementation circuit member positioned more downstream than a fuse, thereby making it possible to arrange the fuse between the input terminal and the switching member after a collective arrangement of the fuse in a fuse box.

According to another aspect of the invention, the fuse box has a short terminal having a terminal portion on both ends. Either one terminal portion of the non-implementation branch path and the implementation circuit member is connected to one terminal portion of the short terminal by using the fuse. The other terminal portion of the non-implementation branch path and the implementation circuit member is connected to the other terminal portion of the short terminal.

According to the above-aspects of the invention, in the event that terminal portions of the output terminal fitting are arranged in parallel and the terminal portions of each implementation branch path, the non-implementation branch path and the implementation circuit member are mutually arranged in parallel, and when a fuse is used to directly connect a terminal portion of the non-implementation branch path to that of the implementation circuit member, only the fuse concerned is in a direction different from that of other fuses. However, a short terminal is allowed to interpose between an implementation circuit member and a non-implementation branch path, a terminal portion of the short terminal is arranged so as to be arranged in parallel with a terminal portion of the output terminal fitting, thus making it possible to arrange a fuse connected to a non-implementation branch path or an implementation circuit member in the same direction as other fuses.

BRIEF DESCRIPTION OF THE DRAWINGS

These and other objects and advantages of this invention will become more fully apparent from the following detailed description taken with the accompanying drawings in which.

DESCRIPTION OF THE PREFERRED EMBODIMENTS

Embodiment 1

Figure 1:
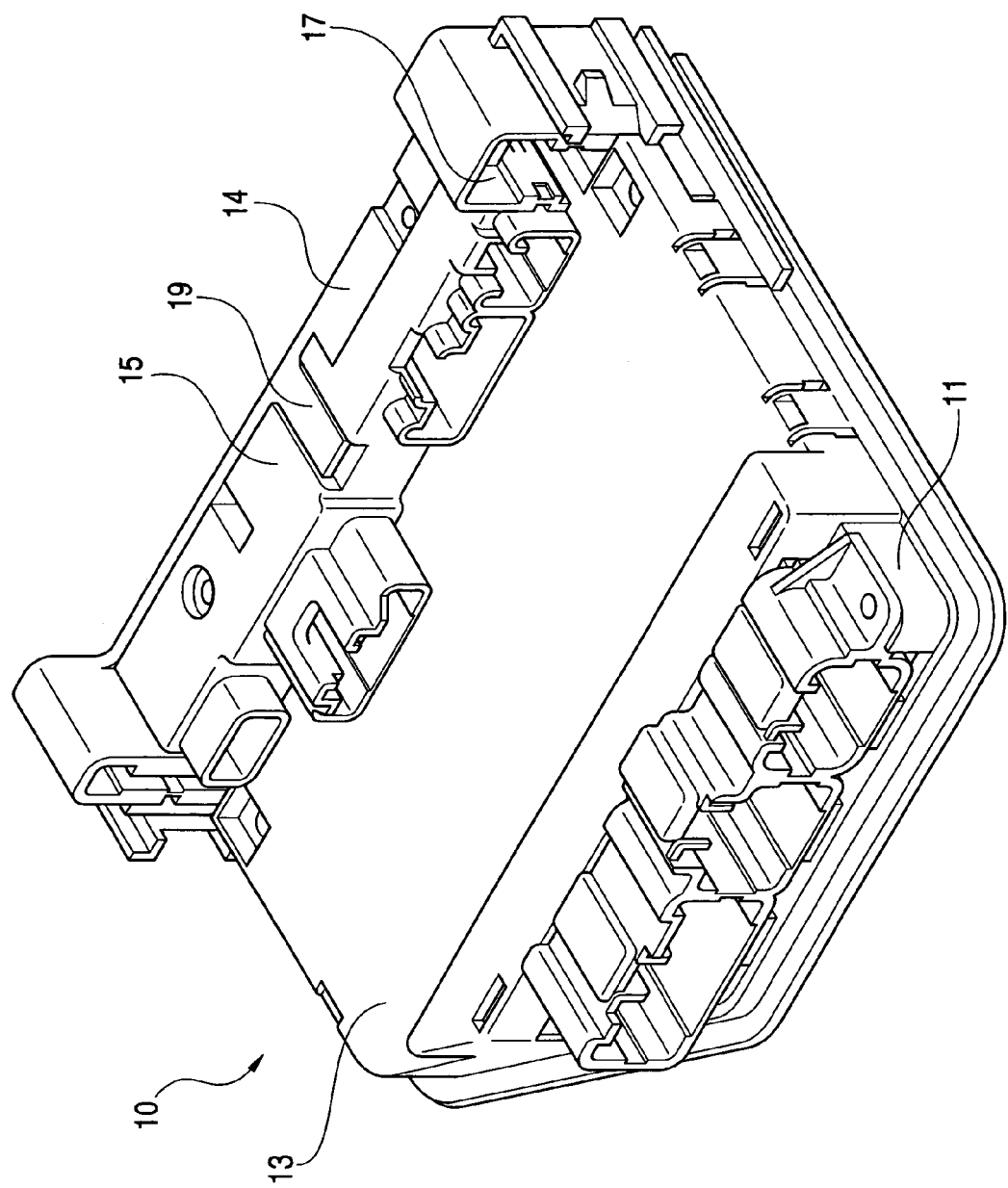
FIG. 1 is a perspective view of the electrical connection box of embodiment 1.

Hereinafter, an explanation will be made for the embodiment 1 with reference to FIG. 1 through FIG. 7. The electrical connection box of the present embodiment is loaded in an automobile, provided between electrical components (not illustrated) (electrically external load) such as a battery (not illustrated), lamp and audio, distributing and supplying electricity supplied from the battery to each electrical component and also taking control such as switching of such a power supply.

The electrical connection box is provided with a case 10 and a circuit component 30 accommodated into the case 10. The case 10 is provided with a frame 11 made of an insulating material such as synthetic resins, a metal radiator plate 12 fixed so as to close an opening (lower plane shown in FIG. 1 and FIG. 2) on the back with respect to the frame 11, and a synthetic resin-made cover 13 fixed so as to close an opening (side opposite the radiator plate 12) on the surface with respect to the frame 11. A synthetic resin-made fuse box 14 is fixed on the upper edges of the frame 11 and the case 10, and a synthetic resin-made upper connector 15 is fixed on the lower plane of the fuse box 14.

Figure 2:
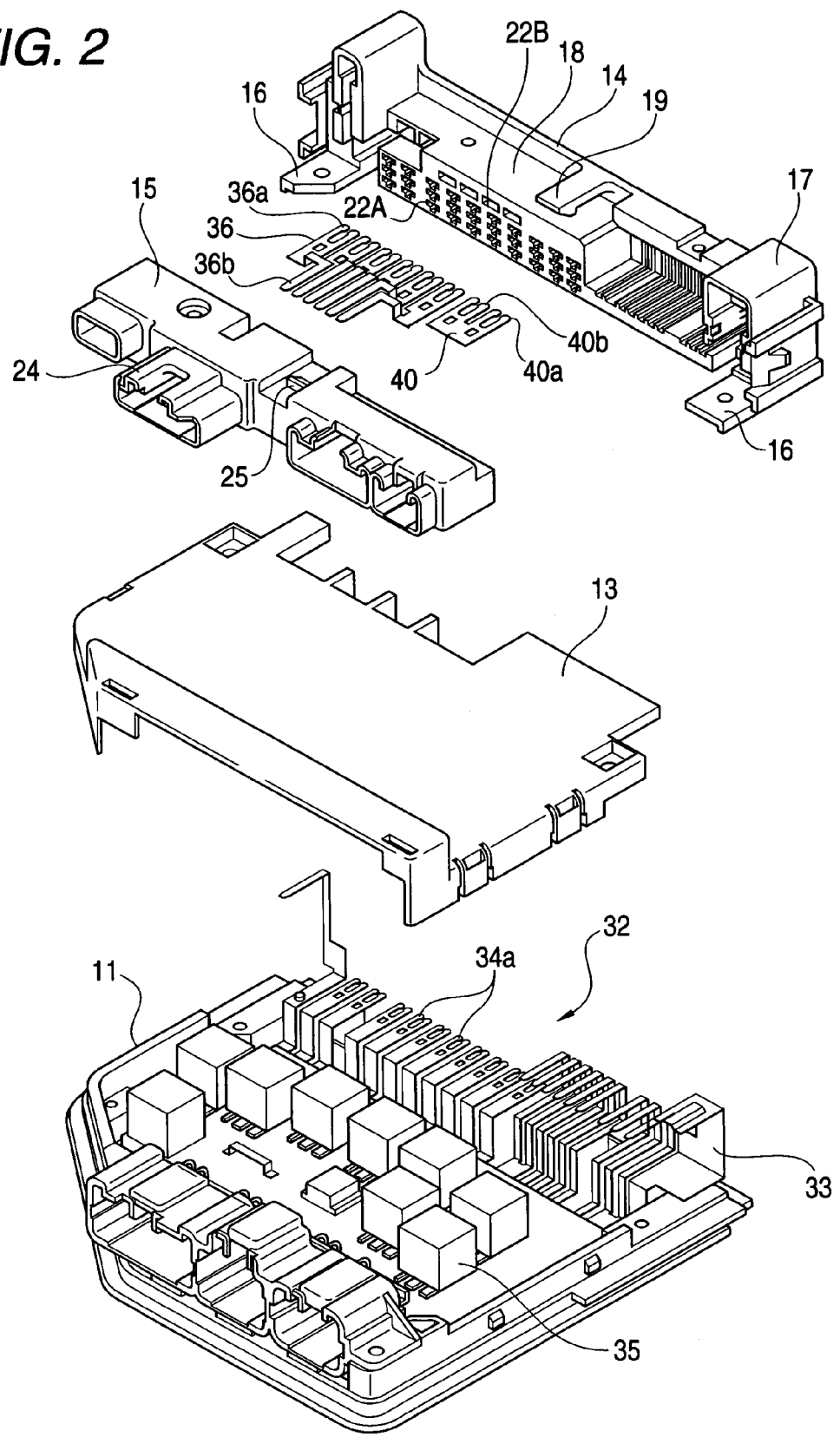
FIG. 2 is an exploded perspective view of the electrical connection box.
Figure 3:
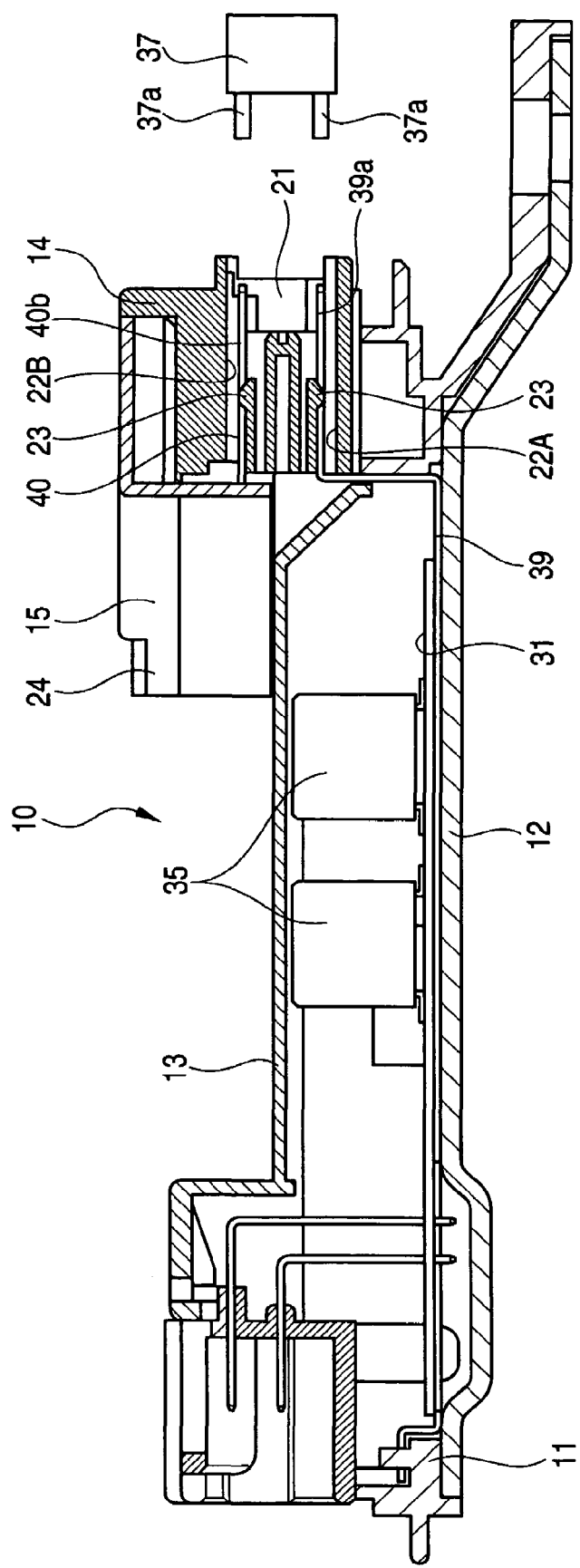
FIG. 3 is a vertical cross-sectional view of the fuse attached to the electrical connection box.
Figure 4:
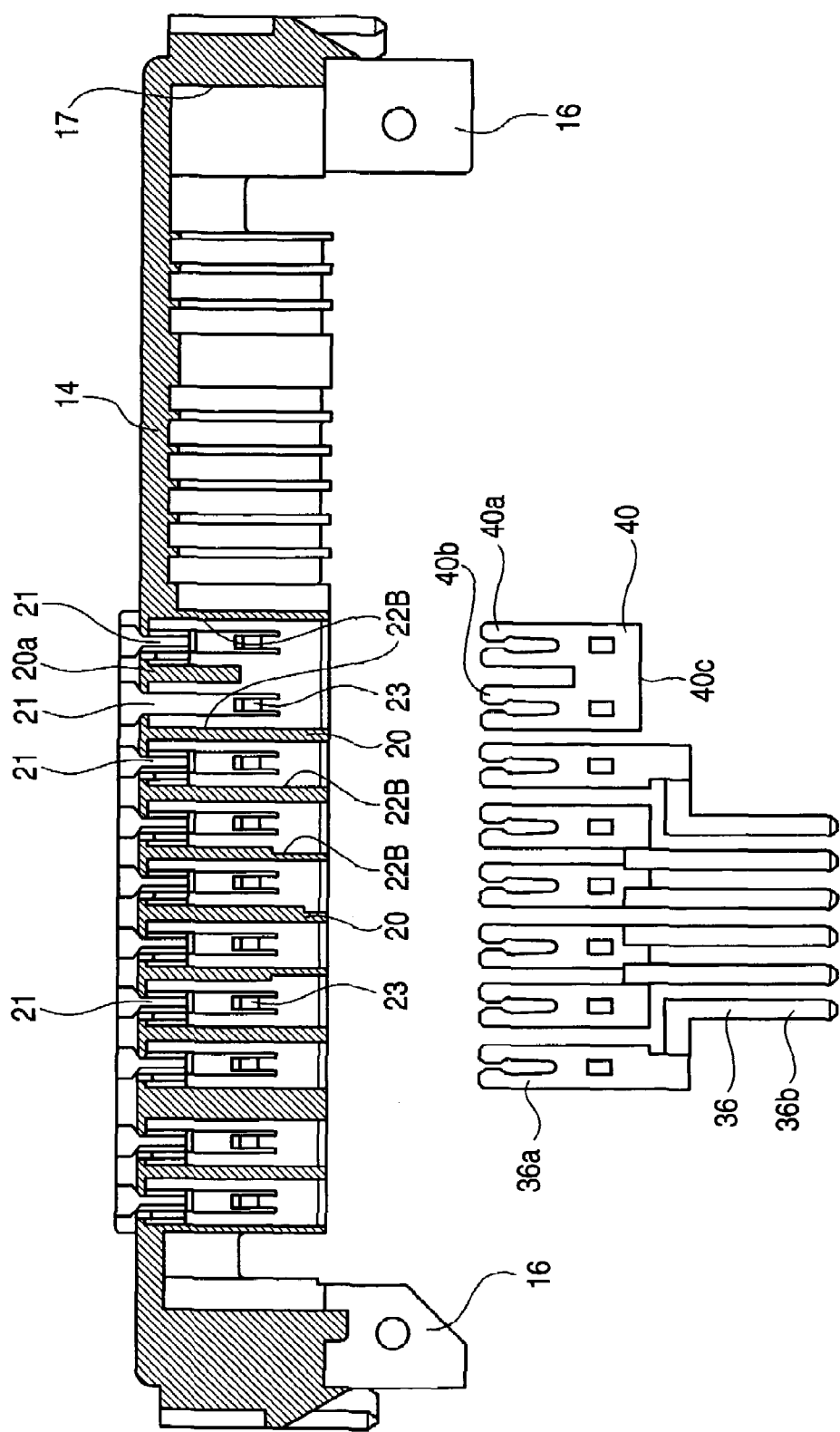
FIG. 4 is a horizontal cross-sectional view of the fuse box from which the output terminal fitting and the short terminal are removed.
Figure 5:
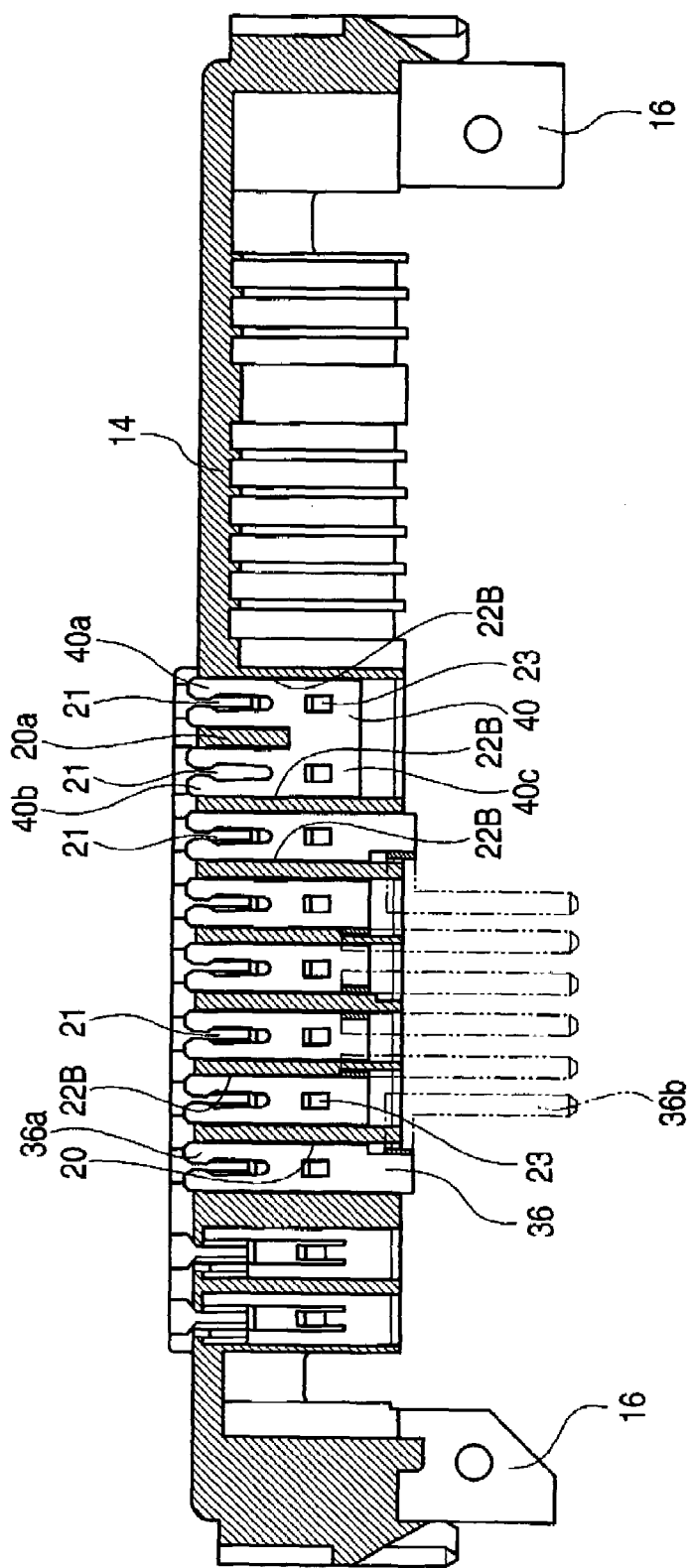
FIG. 5 is a horizontal cross-sectional view showing a state that the output terminal fitting and the short terminal are fixed to the fuse box.
Figure 6:
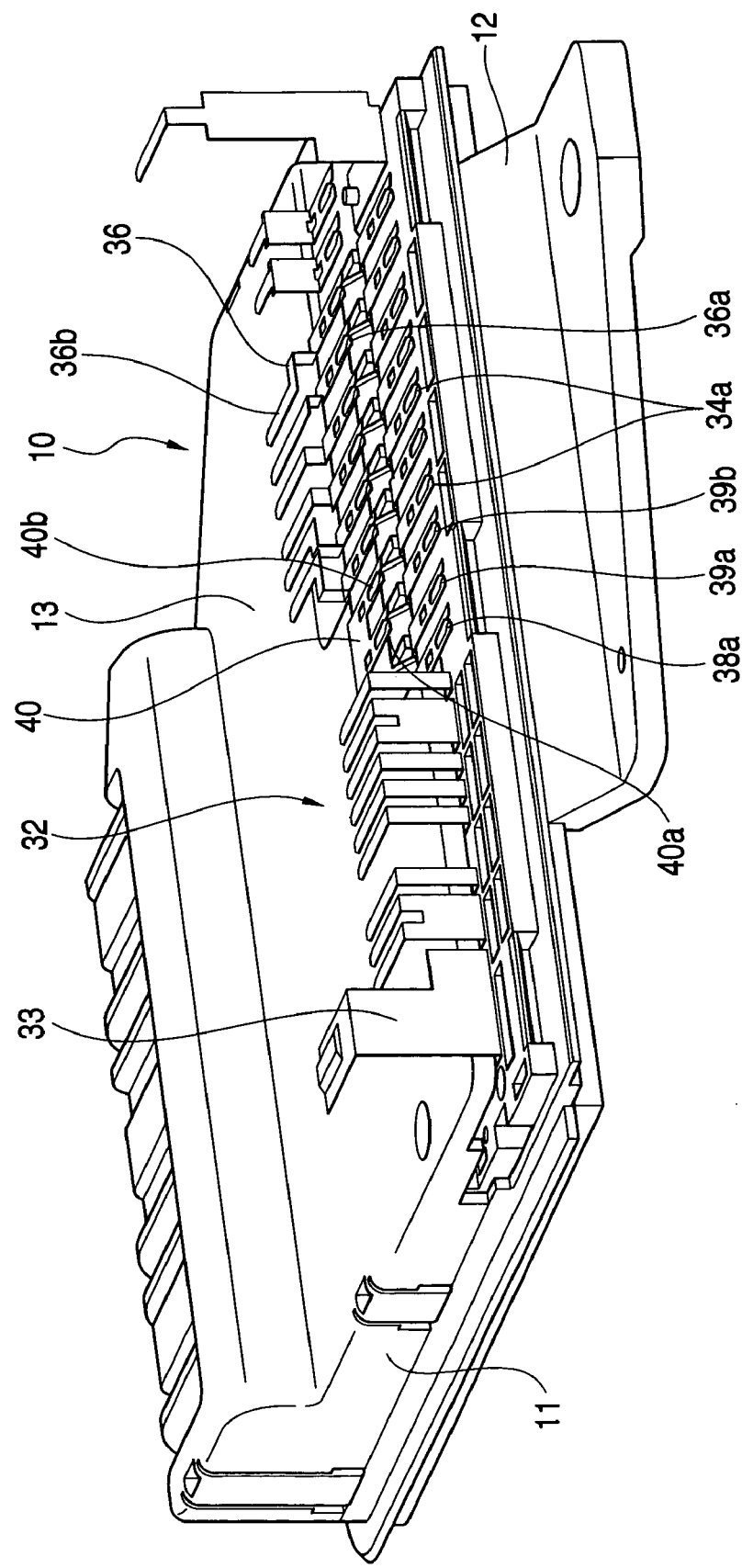
FIG. 6 is a perspective view of the electrical connection box from which the fuse box is removed.

Further, in FIG. 1, FIG. 2 and FIG. 6, the electrical connection box is depicted in such a way that the surface side faces upward as a matter of convenience. However, when loaded in an automobile, the electrical connection box is fixed in the direction as given in FIG. 3.

The fuse box 14 is in a horizontally-long block form extended along a width direction of the circuit substrate 31 and fixed to the frame 11 and the cover 13 by tightening fixing portions 16 on both ends with bolts. Regarding the fuse box 14, the right end shown in FIG. 2 is given as an input connector portion 17 opened downward (on the left lower side in FIG. 2), and a range covering from the left end and almost at the center is given as an accommodating portion 18. Further, a lock arm 19 is provided at the center of the fuse box 14 in a width direction.

A plurality of fuse chambers 21 opened upward and divided by a partition 20 are formed both on the right and the left sides inside the accommodating portion 18. In a similar way, a slit-like terminal accommodating chamber 22 which opens downward is formed inside the accommodating portion 18 so as to communicatively connect with each fuse chamber 21 in pairs. In each fuse chamber 21, the terminal accommodating chamber 22 is arranged so as to be spaced in a direction intersecting at the direction that the fuse chamber 21 is arranged (direction intersecting at the surface of the circuit substrate 31). A lance 23 is formed at each terminal accommodating chamber 22.

An upper connector 15 is in a horizontally-long shape extending to the width direction of the fuse box 14 and provided with a hood portion 24 corresponding to the accommodating portion 18 and a second accommodating portion 19. The upper connector 15 is fixed to the fuse box 14 from downward. The fixed upper connector 15 is locked in a fixed state by allowing the lock projection 25 to lock with a lock arm 19 of the fuse box 14.

A circuit component 30 is provided with a circuit substrate 31, a first bus bar 32 (conducting path), a plurality of relays 35 (switching member), a plurality of fuses 37 and a plurality of output terminal fittings 36.

Figure 7:
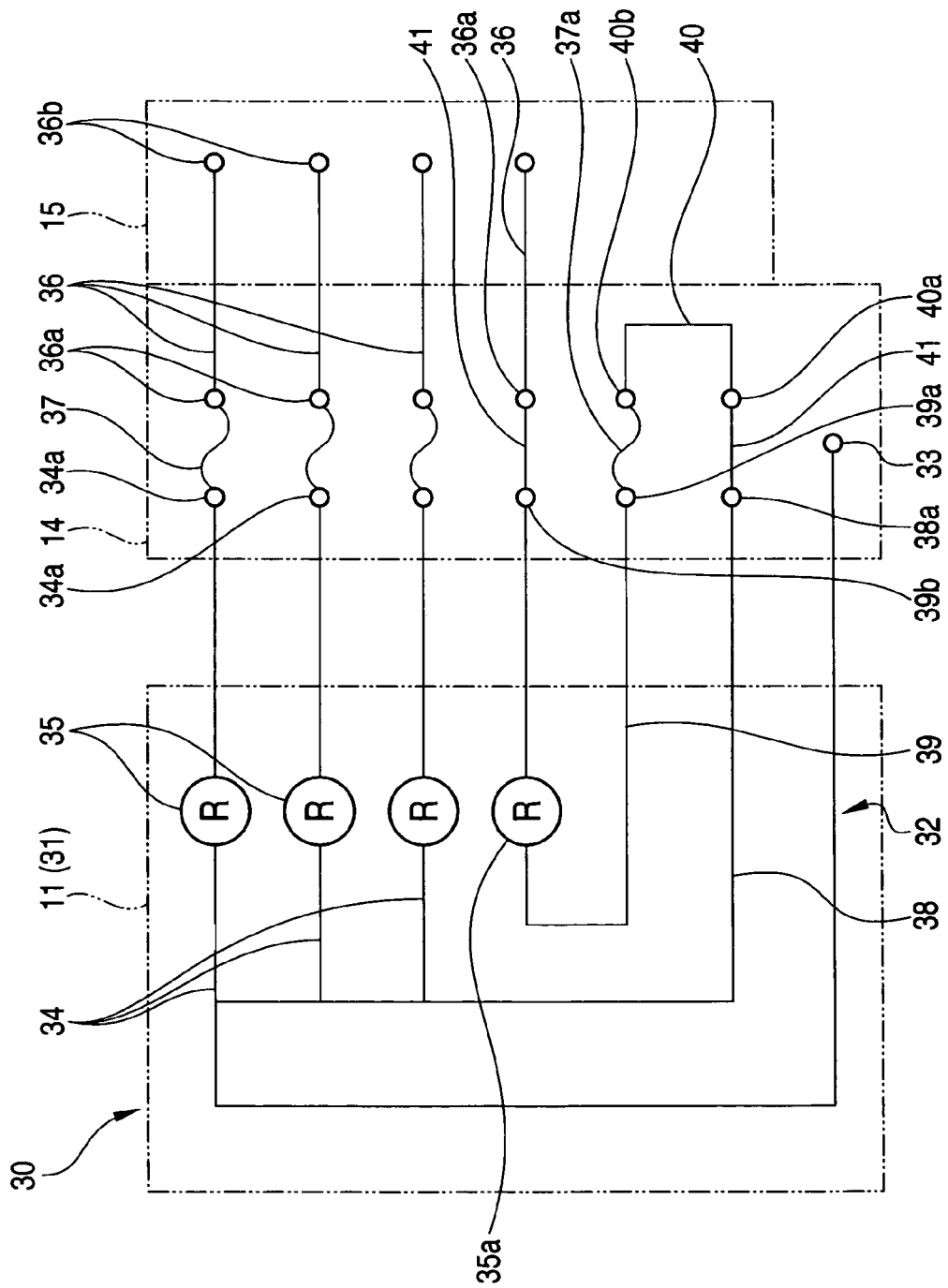
FIG. 7 is a schematic view of the circuit construction.
Figure 8:
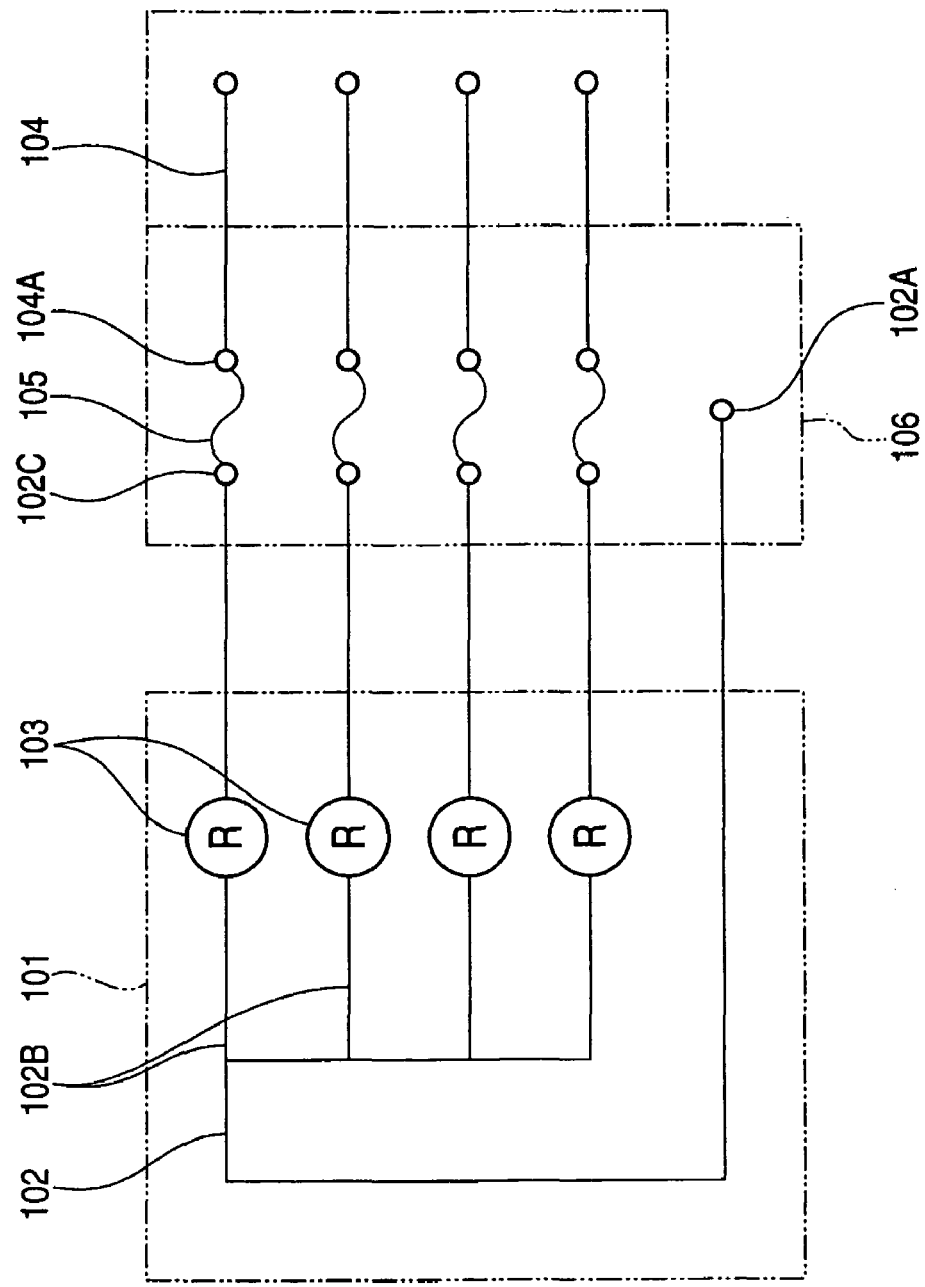
FIG. 8 is a schematic view of the circuit construction of a related art.
Figure 9:
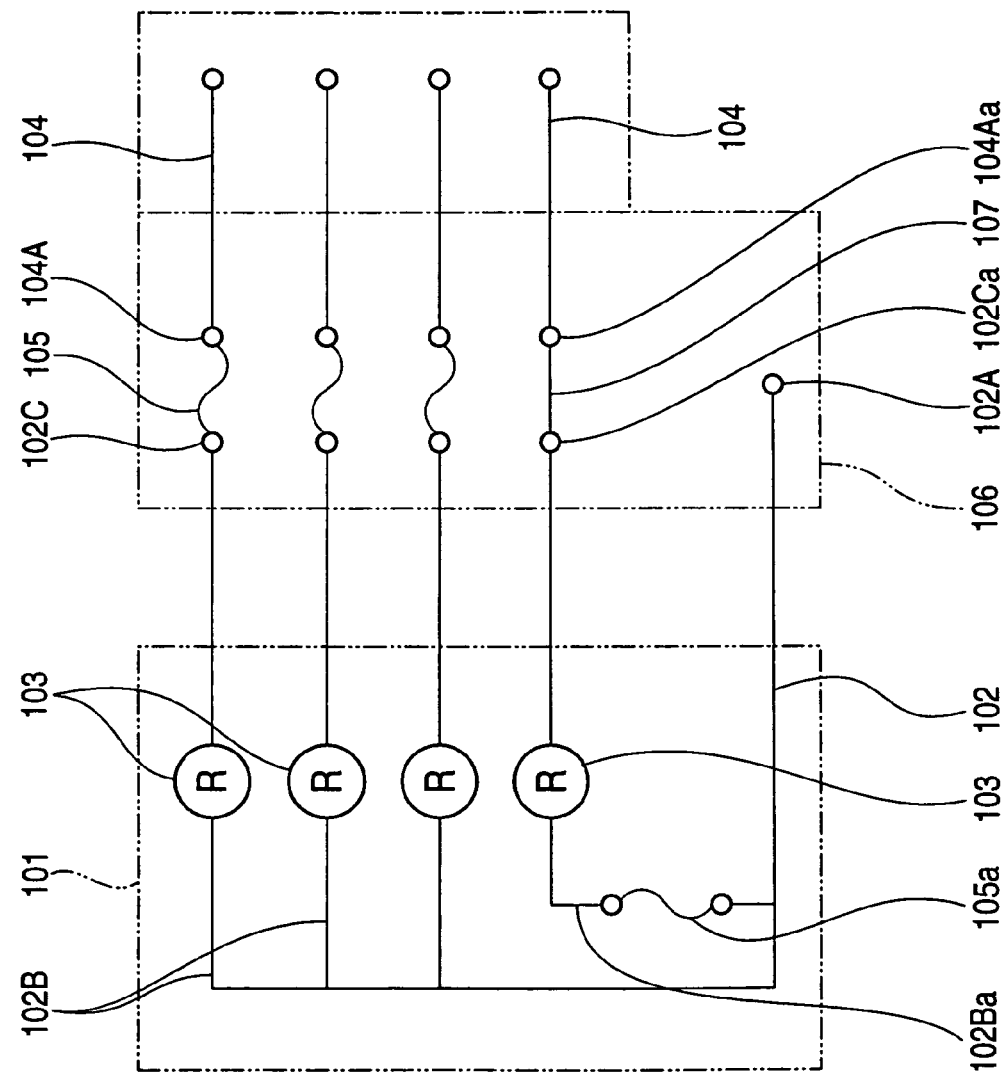
FIG. 9 is a schematic view of the circuit construction of a related art.

The bus bar 32 is formed by bending a metal plate punched out in a predetermined shape and provided with an input terminal 33 connected to a battery as shown in the circuitry schematic view of FIG. 7 and a plurality of implementation branch paths 34 which are in a shape branched from the input terminal 33, and fixed along the back plane of the circuit substrate 31. The input terminal 33 is bent approximately in a U shape and accommodated into an input connector portion 17. A terminal portion 34a which is branched into a fork shape (two-way branch) is formed upward on an approximately L-shaped end of each implementation branch path 34. The terminal portion 34a is fitted from downward into a terminal accommodating chamber 22A closer to the circuit substrate 31 at the accommodating portion 18 of fusebox 14, facing inside the fuse chamber 21, and retained in an unremovable state by locking a lance 23 into a lance hole.

The relay 35 is arranged on the surface of the circuit substrate 31 and implemented into each implementation branch path 34 at a via hole 31H formed on the circuit substrate 31.

As with the first bus bar 32, an output terminal fitting 36 is formed by bending a metal plate and provided in a plurality. As with the terminal portion of the branch path, a terminal portion 36a which is branched into a fork shape (two-way branch) is formed upward on one end of each output terminal fitting 36, and a tab 36b which is bent in approximately an L shape is formed downward on the other end. The output terminal fitting 36 is fitted downward into a terminal accommodating chamber 22B remote from the circuit substrate 31 at the accommodating portion 18, facing inside the fuse chamber 21, and retained in an unremovable state by locking the lance 23 into a lance hole. Thus, a terminal portion 34a of the implementation branch path 34 and a terminal portion 36a of the output terminal fitting 36 correspond as a pair inside each fuse chamber 21. Further, a tab 36b of each output terminal fitting 36 is accommodated into a hood portion 24 of the upper connector 15 so that an electrical component is connected to each 36b.

A fuse 37 is inserted into the fuse box 14 from an opening portion on the upper plane of each fuse chamber 21. The inserted fuse 37 allows a pair of the lead terminals 37a to fit terminal portions 34a and 36a inside the fuse chamber 21, by which the terminal portion 34a of the implementation branch path 34 is connected communicatively via a fuse 37 to the terminal portion 36a of the output terminal fitting 36, thereby providing a flow of electricity output sequentially from the input terminal 33 via a plurality of implementation branch paths 34, fuses 37 and output terminal fittings 36 to the electrical component. In the flow of electricity, the relay 35 is arranged between the input terminal 33 and the fuse 37, namely, more upstream than the fuse 37.

A circuit component 30 is provided with a non-implementation branch path 38 as a means for arranging the fuse 37 at a position more upstream than the relay 35 (position between the input terminal 33 and the relay 35), a second bus bar 39 (implementation circuit member) and a short terminal 40. The non-implementation branch path 38 is made in an integral form with the above-described first bus bar 32, and branched in a parallel form from the input terminal 33 to other implementation branch paths 34. As with the implementation branch path 34, a terminal portion 38a which is branched into a fork shape (two-way branch) is formed upward on an end of the non-implementation branch path 38. The terminal portion 38a of the non-implementation branch path 38 is fitted from downward into a terminal accommodating chamber 22A closer to the circuit substrate 31 at the accommodating portion 18, facing inside the fuse chamber 21, and retained in an unremovable state by locking the lance 23 into a lance hole. In other words, the terminal portion 38a of the non-implementation branch path 38 is arranged in parallel with the terminal portion 34a of the implementation branch path 34. The relay 35 is not implemented into the non-implementation branch path 38. Further, the fuse box 14 is provided with an output terminal fitting 36 corresponding to the terminal portion 38a of the non-implementation branch path 38.

A second bus bar 39 is formed by bending a metal plate punched out into a predetermined shape and separated from the first bus bar 32 having an input terminal 33. The second bus bar 39 is fixed along the back plane of the circuit substrate 31. As with the implementation branch path 34, a relay 35a is implemented into the second 2 bus bar 39 through a via hole 31H of the circuit substrate 31. As with the terminal portion 34a of the implementation branch path 34 and the terminal portion 38a of the non-implementation branch path 38, terminal portions 39a and 39b which are branched into a fork shape (two-way branch) are formed upward on both ends of the second bus bar 39. As with the terminal portion 34a of the implementation branch path 34 and the terminal portion 38a of the non-implementation branch path 38, terminal portions 39a and 39b of the second bus bar 39 are fitted from downward into a terminal accommodating chamber 22A closer to the circuit substrate 31 at the accommodating portion 18, facing inside the fuse chamber 21, and retained in an unremovable state by locking the lance 23 into a lance hole. These two terminal portions 39a and 39b of the second bus bar 39 are arranged in an adjacent terminal accommodating chamber 22. Further, the terminal portion 38a of the above non-implementation branch path 38 is arranged in a terminal accommodating chamber 22A adjacent to one of the terminal portion 39a of the second bus bar 39.

A short terminal 40 is made of a metal plate punched out into a predetermined shape, and available in a shape in which two mutually-parallel terminal portions 40a and 40b are connected with a connecting portion 40c. As with the terminal portion 34a of the implementation branch path 34, the terminal portion 38a of the non-implementation branch path 38 and the terminal portion 36a of the output terminal fitting 36, terminal portions 40a and 40b of the short terminal 40 are also formed upward in a fork shape (two-way branch). As with the output terminal fitting 36, the short terminal 40 is fitted from downward into a terminal accommodating chamber 22B remote from the circuit substrate 31 at the accommodating portion 18, facing inside the fuse chamber 21, and retained in an unremovable state by locking the lance 23 into a lance hole. The short terminal 40 is accommodated into two adjacent terminal accommodating chambers 22B. A partition 20a between these two terminal accommodating chambers 22B is notched for avoiding interference with the connecting portion 20c. One of these two terminal portions 40a and 40b of the short terminal 40 (terminal portions 40a) is arranged at a position corresponding to a terminal portion 38a of the non-implementation branch path 38, while the other terminal (terminal portion 40b) is arranged at a position corresponding to the terminal portion 39a of the second bus bar 39.

One of the terminal portions 40a of the mutually corresponding short terminals 40 and the terminal portion 38a of the non-implementation branch path 38 are connected communicatively via a direct terminal 41 fixed to a fuse chamber 21. Since the direct terminal 41 is fitted into the fuse chamber 21 without rattle, it is provided with a block-shaped knob (not illustrated). The other terminal portion 40b of the mutually corresponding short terminals 40 and the terminal portion 39a of the second bus bar 39 are connected via a fuse 37 fixed to the fuse chamber 21.

Further, the accommodating portion 18 is provided with an output terminal fitting 36 corresponding to the other terminal portion 39b of the second bus bar 39 and a terminal portion 36a corresponds to the terminal portion 39b of the second bus bar 39. The other terminal portion 39b of the mutually corresponding second bus bar 39 is connected to the terminal portion 36a of the output terminal fitting 36 via the direct terminal 41.

The circuit component 30 of the present embodiment is constructed by a circuit in which the relay 35 is positioned between the input terminal 33 and the fuse 37 (circuit in which the fuse 37 is positioned more downstream than the relay 35) and a circuit in which the fuse and the relay are positioned reversely, namely a circuit in which the fuse 37a is positioned between the input terminal 33 and the relay 35a (circuit in which the fuse 37a is positioned more upstream than the relay 35a).

In the present embodiment, as a means for constructing the latter circuit, it is structured in that a terminal portion 38a branched from the input terminal 33 and formed at an end side opposite the input terminal 33 is arranged inside the fuse box 14, anon-implementation branch path 38 into which the relay 35 is not implemented, a second bus bar 39 is provided in which a pair of terminal portions 39a and 39b formed on both ends and separated from the input terminal 33 into which the relay 35 is implemented are arranged in the fusebox 14,***1) a terminal portion 38a of the non-implementation branch path 38 is connected to one terminal portion 39a of the second bus bar 39 via the fuse 37a in the fuse box 14 and an electrical component is connected to the other terminal portion 39b of the second bus bar 39 via the output terminal fitting 36. Such construction makes it possible that all the fuses 37 and 37a are collectively arranged on a fuse box 14 and the fuse 37a is arranged between the input terminal 33 and the relay 35a.

Further, in the present embodiment, terminal portions 36a of the output terminal fitting 36 are mutually arranged in parallel, and terminal portions 34a, 38a, 39a and 39b of each implementation branch path 34, non-implementation branch path 38 and second bus bar 39 are also mutually arranged in parallel. When terminal portions 38a, 39a and 39b of the non-implementation branch path 38 and the second bus bar 39 are connected directly with a fuse in such an arrangement, only the fuse is directed different from that of other fuses 37. However, in the present embodiment, a short terminal 40 is provided between the second bus bar 39 and the non-implementation branch path 38 and terminal portions 40a and 40b of the short terminal 40 are arranged so as to be in parallel with the terminal portion 36a of the output terminal fitting 36, by which a fuse 37a connecting between the non-implementation branch path 38 and the second bus bar 39 can be arranged in the same direction as other fuses 37 (fuse 37 connecting between the implementation branch path 34 and the output terminal fitting 36).

OTHER EMBODIMENTS

The present invention shall not be restricted to the embodiments explained with reference to the above description and drawings, and for example, the following embodiments may be included in the technical field of the present invention. In addition, embodiments other than the following may be implemented, with modifications in a scope that does not deviate from the gist of the present invention.

(1) In the above embodiment, a short terminal is provided in a fuse box. However, according to the above-embodiments, no short terminal is provided but a fuse is used to directly connect a terminal portion of the non-implementation branch path to a terminal portion of the implementation circuit member.

(2) In the above embodiment, a fitting is used to directly connect the non-implementation branch path to the short terminal, and a fuse is used to connect the implementation circuit member to the short terminal. However, according to the above-embodiments, a fuse may be used to connect a terminal portion of the non-implementation branch path to a terminal portion of the short terminal, and a fitting may be used to directly connect a terminal portion of the implementation circuit member to a terminal portion of the short terminal.

(3) In the above embodiment, a fitting is used to directly connect the short terminal to the non-implementation branch path. However, according to the above-embodiments, a male/female fitting means may be used to directly connect the short terminal to the non-implementation branch path.

(4) In the above embodiment, a terminal portion of the implementation circuit member is indirectly connected to a terminal portion of the output terminal via a direct fitting. According to the above-embodiments, a male/female fitting means may be used to directly connect a terminal portion of the implementation circuit member to the output terminal fitting.

(5) In the above embodiment, an output terminal fitting is allowed to interpose between the implementation circuit member and the electrical external load. According to the above-embodiments, no output terminal fitting is provided but an electrical external load may be directly connected to a terminal portion of the implementation circuit member.

What is claimed is:

1. An electrical connection box comprising:
a case;
a circuit component being accommodated into the case;
the circuit component having;
a circuit substrate;
a switching member;
a fuse;
a plurality of output terminal fittings having a terminal portion; and
a conducting path arrayed along a circuit substrate, the conducting path having;
an input terminal connected to a battery; and
a plurality of implementation branch paths branched from the input terminal, each implementation branch path implementing a switching member and having a terminal portion on an end portion thereof; and
a fuse box being mounted on an outer edge portion of the case, the fuse box attaching the plurality of output terminal fittings to which an electrical external load having an electrical component is connected, wherein the terminal portion of each implementation branch path is disposed to be corresponding to the terminal portion of each output terminal fitting,
wherein the fuse fixed to the fuse box connects the terminal portion of each implementation branch path to the terminal portion of each output terminal fitting, so that a flow of electricity output is sequentially formed from the input terminal via the implementation branch path, the fuse and the output terminal fitting,
wherein a non-implemented branch path branched from the input terminal has on an end side opposite to the input terminal a terminal portion which is arranged within the fuse box,
wherein the non-implemented branch path does not implement the switching member,
wherein an implemented circuit member separated from the input terminal has on both ends thereof a pair of terminal potion which is disposed in the fuse box,
wherein the implemented circuit member implements the switching member,
wherein a terminal portion of the non-implementation branch path is connected to one terminal portion of the implementation circuit member via the fuse in the fuse box, and
wherein the electrical external load is connected to the other terminal portion of the implementation circuit member.

2. An electrical connection box according to claim 1, wherein the fuse box has a short terminal having a terminal portion on both ends,
wherein either one terminal portion of the non-implementation branch path and the implementation circuit member is connected to one terminal portion of the short terminal by using the fuse, and
the other terminal portion of the non-implementation branch path and the implementation circuit member is connected to the other terminal portion of the short terminal.

* * * * *